United States Patent
Nolterieke et al.

(10) Patent No.: US 8,627,118 B2
(45) Date of Patent: Jan. 7, 2014

(54) CHASSIS POWER ALLOCATION USING EXPEDITED POWER PERMISSIONS

(75) Inventors: Michael H. Nolterieke, Raleigh, NC (US); William G. Pagan, Durham, NC (US)

(73) Assignee: International Business Machines Corporation, Armonk, NY (US)

( * ) Notice: Subject to any disclaimer, the term of this patent is extended or adjusted under 35 U.S.C. 154(b) by 637 days.

(21) Appl. No.: 12/785,818

(22) Filed: May 24, 2010

(65) Prior Publication Data
US 2011/0289327 A1 Nov. 24, 2011

(51) Int. Cl.
*G06F 1/26* (2006.01)
*G06F 1/32* (2006.01)

(52) U.S. Cl.
USPC ............................ 713/300; 713/310; 713/320

(58) Field of Classification Search
USPC .......................................... 713/300, 310, 320
See application file for complete search history.

(56) References Cited

U.S. PATENT DOCUMENTS

| | | | |
|---|---|---|---|
| 5,752,046 A | 5/1998 | Oprescu et al. | |
| 6,804,616 B2 * | 10/2004 | Bodas | 702/61 |
| 7,043,647 B2 | 5/2006 | Hansen et al. | |
| 7,051,215 B2 * | 5/2006 | Zimmer et al. | 713/300 |
| 7,353,415 B2 * | 4/2008 | Zaretsky et al. | 713/320 |
| 7,484,111 B2 | 1/2009 | Fund | |
| 2002/0007463 A1 | 1/2002 | Fung | |
| 2004/0117536 A1 | 6/2004 | Franke et al. | |
| 2004/0268157 A1 | 12/2004 | Dake et al. | |
| 2006/0206730 A1 * | 9/2006 | Cartes et al. | 713/300 |
| 2007/0061599 A1 * | 3/2007 | Mentzer et al. | 713/300 |
| 2008/0136607 A1 | 6/2008 | Ratcliff et al. | |
| 2008/0244283 A1 | 10/2008 | Elliott et al. | |
| 2008/0244311 A1 | 10/2008 | Elliott et al. | |
| 2008/0313476 A1 * | 12/2008 | Hansen | 713/300 |
| 2009/0171511 A1 | 7/2009 | Tolentino | |

* cited by examiner

*Primary Examiner* — Paul Yanchus, III
*Assistant Examiner* — Zahid Choudhury
(74) *Attorney, Agent, or Firm* — Cynthia G. Seal; Jeffrey L. Streets

(57) ABSTRACT

In one embodiment, a fixed chassis power budget is dynamically allocated to a plurality of servers inserted into a multi-server chassis. An inserted server may be inventoried by sequentially identifying server components, categorically-defined component power limits, and actual component power requirements of the inventoried components. A power permission may be granted to the inserted server prior to completion of the inventory, based on power-related information inferred from a chassis and server specification or from the inventoried components.

15 Claims, 3 Drawing Sheets

| Type "XYZ" CHASSIS (2000W Budget) ||||
|---|---|---|---|
| Server Bay | Server | Server Power Limit | Server Power Requirement |
| 1 | Type ABC | 500 | 400 |
| 2 | Type ABC | 500 | 450 |
| 3 | Type ABC | 500 | 300 |
| 4 | Type ABC | 500 | 400 |
| ... | ... | ... | ... |
| M | (empty) | TBD | TBD |
| | TOTAL--> | 2000 | 1550 |

62  64  66  68

450W Unallocated Power = 2000W − 1550W

FIG. 3

| SERVER M (Type "ABC") |||||
|---|---|---|---|---|
| Time $T_N$ | Component/ Port (N) | Component Category | Component Power Limit | Component Power Requirement |
| $T_1$ | 1 | Processor 1 | 100 | 75 |
| $T_2$ | 2 | Processor 2 | 100 | 75 |
| $T_3$ | 3-10 | DIMM x8 | 50 | 30 |
| $T_4$ | 11 | Graphics Card | 40 | 25 |
| $T_5$ | 12 | Expansion Slot 1 | 30 | 25 |
| $T_6$ | 13 | Expansion Slot 2 | 30 | 30 |
| $T_7$ | 14 | HD1 | 75 | 45 |
| $T_8$ | 15 | HD2 | 75 | 45 |
| | | TOTAL--> | 500 | 350 |

50W liberated 70  72  74  76  78

FIG. 4

CHASSIS POWER ALLOCATION USING EXPEDITED POWER PERMISSIONS

BACKGROUND

1. Field of the Invention

The present invention relates to power management in a rack-mountable server chassis.

2. Background of the Related Art

A datacenter is a facility having one or more racks of computer equipment housed in a computer room for convenient access by datacenter personnel. The computer room provides a controlled environment and infrastructure conducive to operating the computer equipment. For example, a computer room may provide electrical utilities with the capacity to power a large volume of rack-mounted computer equipment, and a cooling system capable of removing the correspondingly large quantity of heat generated by the rack-mounted computer equipment. The cooling system in many installations will include a particular arrangement of equipment racks into alternating hot aisles and cold aisles, and a computer room air conditioner ("CRAC") capable of maintaining a room temperature well below the temperature limits of the computer equipment.

Each rack may support one or more equipment chassis in a stacked relationship. For example, a rack mountable multi-server chassis typically includes multiple server bays having standardized dimensions, so that each server bay can receive a server of corresponding size. The server bays may be closely spaced and aligned to consolidate the servers in a compact, high-density arrangement. A multi-server chassis will also typically include support modules providing shared resources to the servers, such as a power module providing electrical power to the servers, a blower module for moving air through the servers, a network module providing network connectivity to the servers, and a supervisory controller for managing power and other chassis resources. Using support modules to provide shared resources allows the individual servers and the chassis receiving the servers to be made even smaller and more compact.

Servers are typically hot pluggable, so that each server may be individually inserted into a respective bay without significant interruption to any other servers already installed and operating within the multi-server chassis. When a server is inserted into a server bay of the chassis, connectors on the back of the server may mate with corresponding connectors on a midplane or backplane within the chassis, providing electrical power to the server and network connectivity between the server and other servers and equipment. A server may also boot when inserted into a bay. As the server boots, the server may gather information about its own onboard resources, such as hardware and software. When this process is complete, the server may request an amount of power permission from the supervisory controller. The length of time it takes for a server to fully boot, and to subsequently request power permission from a supervisory controller, can be considerable. In some systems, this process of generating an inventory may take more than a minute to complete.

BRIEF SUMMARY

A first example embodiment of the present invention provides a method, wherein a fixed chassis power budget is allocated among one or more servers in a multi-server chassis. An insertion of a server into the multi-server chassis is detected. The inserted server is inventoried in response to the insertion. The inventorying includes sequentially identifying a plurality of server components and obtaining a component power requirement of each server component. A power permission is granted to the inserted server prior to completing the inventorying. Upon completing the inventorying, a power permission is granted to the inserted server according to the total power requirements of the plurality of server components.

A second example embodiment of the invention provides a power management system including a local controller on a server and a supervisory controller on the multi-server chassis. The local controller is configured for generating an inventory of server components of a server in response to insertion of the server into a multi-server chassis, and for requesting a power permission upon completion of the inventory as a function of the inventoried server components. The supervisory controller is configured for dynamically allocating a fixed chassis power budget among servers in the chassis, including selectively granting the requested power permission to the inserted server upon completion of the inventory and granting a power permission to the inserted server prior to completion of the inventory.

A third example embodiment provides a computer program product including computer usable program code embodied on a computer usable storage medium. The computer program product includes computer usable program code for allocating a fixed chassis power budget among one or more servers in a multi-server chassis, for detecting an insertion of a server into the multi-server chassis, for receiving and selectively granting a request for a power permission from the inserted server, and for granting a power permission to the inserted server prior to receiving the request for the power permission.

BRIEF DESCRIPTION OF THE SEVERAL VIEWS OF THE DRAWINGS

FIG. 3 is a table providing an example of a chassis power budget for the hypothetical type-XYZ chassis of FIG. 1.

FIG. 4 is a table providing an example inventory for an individual server.

DETAILED DESCRIPTION

Embodiments of the present invention are directed to expediting power permission to a server after it has been installed in a multi-server chassis. In one embodiment, a chassis supervisory controller dynamically allocates a fixed power budget among the servers in the chassis, including selectively granting power permissions to each of the installed servers. In response to the insertion and connection of a server, an inventory is generated to identify the components of the installed server and the power requirements associated with those components. Although the total server power requirement is not known until completion of the inventory, power permission may be granted to a server prior to completing an inventory of the components included within the server. In some cases, power permission may be granted to a server even prior to obtaining any component inventory data about the server.

The maximum power requirement of a specific server is a function of its individual components and is often less than a server power limit (SPL) specified for a server of its type. For example, a server specification may limit every server of a hypothetical type "ABC" to a server power limit of 500 W. However, the actual power requirement of a particular type-ABC server may be less than the server power limit of 500 W, depending on how the server is configured. For example, a fully functioning type-ABC server may have fewer than all of the components allowed by the server specification, or the power requirements of the individual components may be less than the power limits for that component as provided by the server specification. Thus, if the chassis power budget has a sufficient amount of power remaining unallocated to other servers, power permission may be granted to an additional server in the full amount of the server power limit (e.g. 500 W) without any delay waiting for a server component inventory. As the inventory process progresses, and/or upon completion of the inventory, the power permission may be granted or adjusted according to the actual power requirements of inventoried components. Thus, power permission may be granted to a server before a full inventory can be obtained.

The method may be implemented in the form of a computer program product embodied on a computer usable storage medium including computer usable program code for performing the methods steps. The method may also be implemented by a power management system including a supervisory controller, such as the chassis management module, and a local controller provided on each server.

Figure 1:
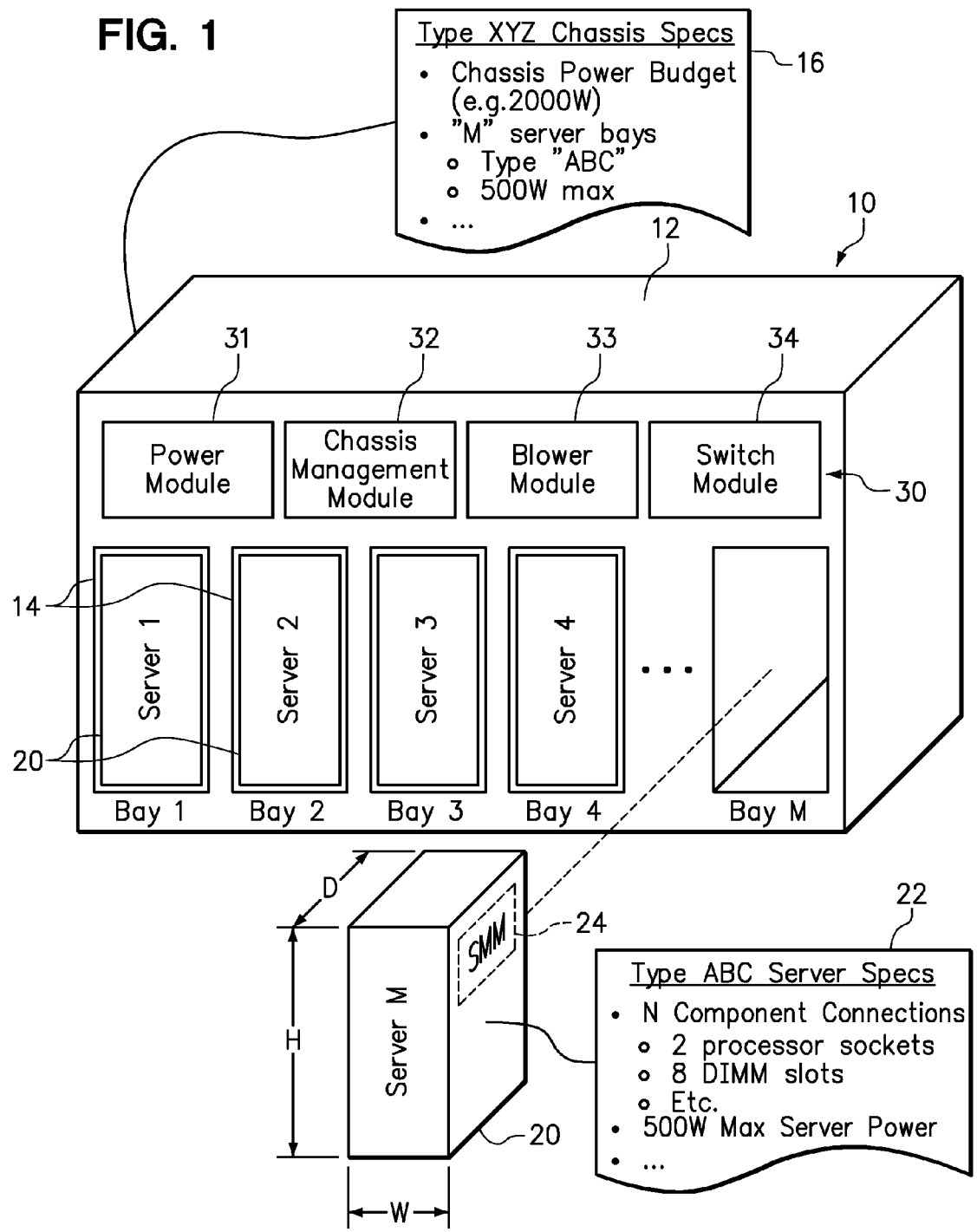
FIG. 1 is a schematic diagram of a computer system that may be power-managed according to one or more embodiments of the invention.

FIG. 1 is a schematic diagram of a computer system 10 that may be power-managed according to one or more embodiments of the invention. The computer system 10 includes a rack mountable multi-server chassis 12 having a plurality ("M") of server bays 14 for receiving up to a like number of servers 20. The servers 20 are labeled from "Server 1" to "Server M" and the server bays 14 are individually labeled "Bay 1" to "Bay M." Each server bay 14 may have a standard size, as set forth in a chassis specification 16, for receiving a server 20 having corresponding standard dimensions of height "H," width "W," and depth "D." The standard, uniform sizing of the server bays 14 and of the servers 20 allows the servers 20 to be interchangeably inserted into any of the bays 14 for hot plugging into the chassis 12. The first four bays (Bay 1 to Bay 4) are shown occupied by four servers (Server 1 to Server 4) having been inserted into respective server bays 14. Server M is shown outside the chassis, but ready for insertion into Bay M, as indicated.

The servers 20 in this embodiment are optionally blade servers, which receive shared chassis resources such as power, cooling, and network connectivity from a plurality of support modules 30 in the chassis. The support modules 30 include, by way of example, a power module 31, a chassis management module 32, a blower module 33, and a network switch module 34. The power module 31 supplies power to the servers 20 currently in the chassis 12. The chassis management module 32 manages chassis resources, such as the allocation of power from the power module 31 to the various servers 20 in the chassis 12. The blower module 33 generates airflow through the chassis 12 to cool the servers. The network switch module 34 provides connectivity between the chassis 12 and a network, such as a local area network (LAN) or a wide area network (WAN), such as the Internet. More than one support module of the same particular type may be provided in the chassis 12, either as redundant support modules or as support modules operating in tandem, so that the described functionality of a support module may equally apply to the functionality of a redundant support module of the same type, or to the combined functionality of two or more support modules of the same type.

The chassis 12 in this embodiment has a hypothetical chassis type "XYZ." The chassis 12 is configured according to the chassis specification 16 for the type-XYZ chassis. The chassis specification 16 defines various physical and electrical chassis parameters for the type-XYZ chassis 12. For example, the chassis specification 16 may include the number of server bays and the type of server(s) that is/are compatible with the chassis. Here, a hypothetical type "ABC" server is compatible with the chassis 12. The chassis specification 16 also includes a fixed chassis power budget predefined for a type-XYZ chassis having M server bays 14. The chassis power budget establishes a total amount of power allowed to the chassis 12. The chassis power budget may be allocated among the servers 20 by the chassis management module 32.

Each server 20 in this embodiment is the hypothetical type "ABC" server configured according to a server specification 22. The server specification 22 may include, for example, a specific listing of categories of components that may be included with a type-ABC server, along with the corresponding connections (such as slots, ports, or sockets) for "N" server components. The term "server component" may include a hardware element and a software element such as firmware used to operate the hardware. The hardware and software elements may both affect the power requirement of a component. The server specification 22 defines the permissible components by categories (for example processors, memory modules, and graphics cards), without limiting each connection to a particular part number. Thus, a connection for a particular category of server component may interchangeably receive more than one different component of that category and have a component power requirement of less than or equal to a categorically-defined component power limit. For example, the server specification 22 includes two processor sockets (category=processor) and eight DIMM slots (category=memory module or DIMM), but does not limit each processor socket to receiving only one specific model number of processor. Accordingly, a 100 W processor, a 75 W processor, and a 50 W processor may each be interchangeably operable with one of the processor sockets. Thus, the particular selection of installed components determines the actual power requirement of the components and, accordingly, affects the total power requirement of the server. Not all ports, slots, or sockets are required to be occupied for a functioning type-ABC server. For example, a functioning server may be configured with only one processor and four DIMMs, leaving a second processor socket and four DIMM slots unoccupied.

The chassis management module 32 cannot immediately ascertain the actual power requirement of a particular server 20 upon insertion. Rather, the server must first take an inventory to identify the components and their corresponding power requirements. The total power requirement of the inserted server is the sum of the power requirements of the components in the inventory. However, the server specification 22 and chassis specification 16 provide information about the inserted server that is useful in managing power to the chassis 12. Specifically, the chassis management module can determine certain parameters of the server directly from the chassis specification 16. For example, the chassis specification 16 limits a type-XYZ chassis 12 to receive only type-ABC servers. Therefore, the chassis management module 32 can be programmed with the server power limit (500 W in this example) of any received server 20 based on the server specification 22. In an alternative implementation, the chassis 12 may receive more than one type of server, and the chassis management module 32 is configured to detect the server type upon insertion, such as by transferring vital product data (VPD) or having a unique pin configuration. In yet another implementation, the chassis may not be programmed with the server power limit of a type-ABC server, and the inserted server, itself, could instead report to the chassis a server power limit for a server of its type. The server power limit is one example of information may be used by the chassis management module, as described further below, to expedite the granting of a power permission to an inserted server prior to completion of a server inventory for the inserted server.

Typically, a server management module ("SMM") will automatically inventory the components of a server 20 in response to insertion of the server 20 into a server bay 14. The process of generating the inventory may be controlled by the server management module 24, the chassis management module 32, or both. Optionally, the server management module may be an integrated management module (IMM) and/or the chassis management module may be an advanced management module (AMM). The server management module 24 is a service processor on the system board of the server 20 that may optionally also perform conventional power management tasks, such as monitoring the power consumption of the server 20 and throttling the processors and memory. The process of generating an inventory may be part of a server boot process or a separate process controlled by the server management module 24. In the context of managing power to the servers 20, the chassis management module 32 is a supervisory controller and the server management module 24 on each server 20 is a local controller.

Figure 2:
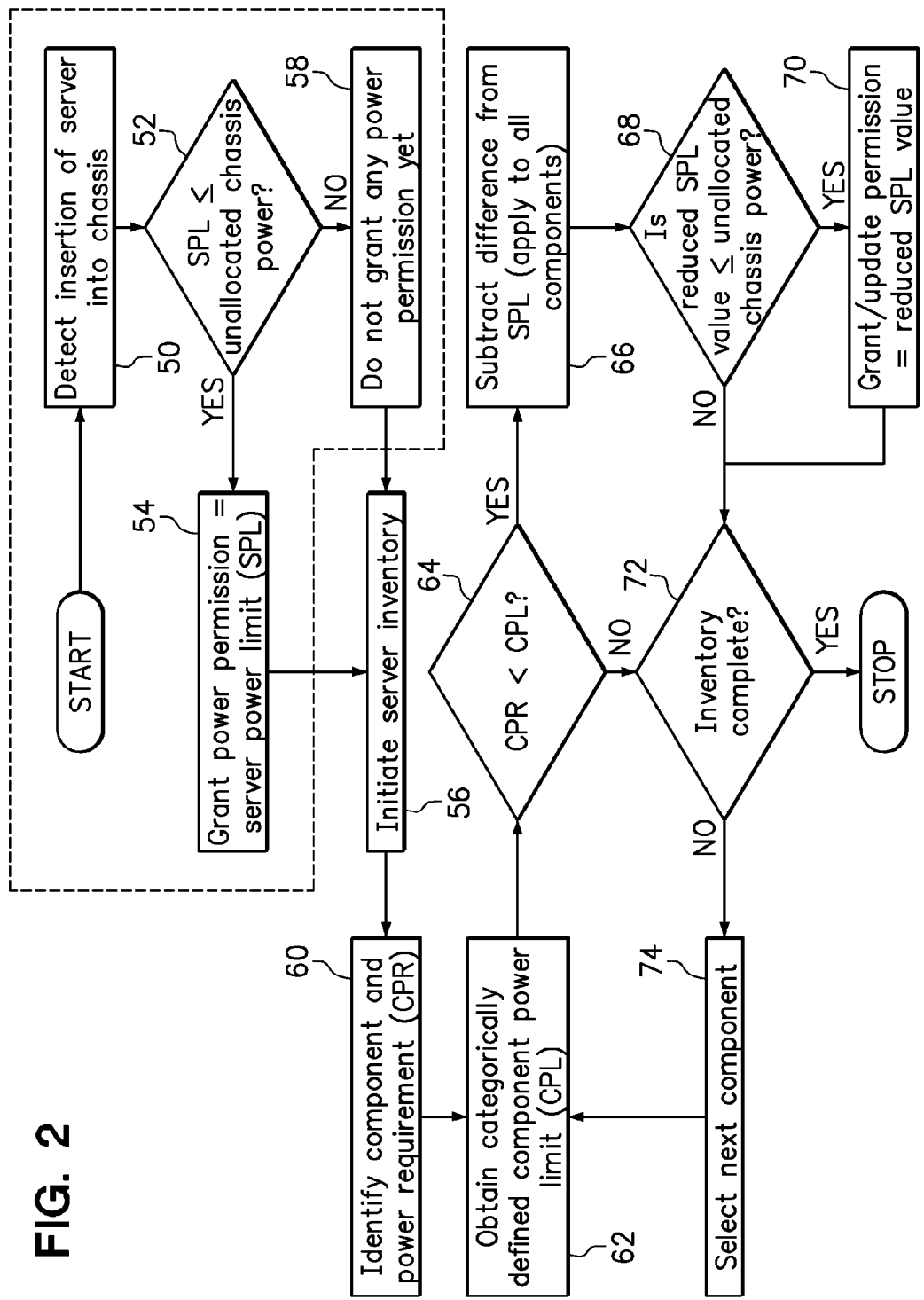
FIG. 2 is a flowchart summarizing a method of managing a chassis power budget according to an embodiment of the invention.

FIG. 2 is a flowchart summarizing a method of managing a fixed chassis power budget according to an embodiment of the invention. The chassis power budget may be predefined in a chassis specification according to chassis type, or otherwise programmed or manually entered to be accessible to the chassis management module. Step 50 involves detecting the insertion of a server into a chassis. In one implementation, a chassis management module may invoke a server power limit with a value equal to a power limit set by the chassis specification for the server bay into which the server is inserted. In another implementation, the chassis management module may infer a server power limit from a server specification of the inserted server. In yet another implementation, the inserted server may read the VPD for its model type and look up the server power limit for a server of its type or model number. and report the server power limit to the chassis management module. Alternatively, a combination of the foregoing server power limit approaches may be used. For example, the chassis may initially set a server power limit according to a power limit for the chassis bay in the chassis specification, and the server may subsequently report its actual server power limit (which may be a lower value than the chassis-specified server power limit). Step 52 involves comparing the server power limit for the inserted server to the unallocated chassis power. The unallocated chassis power may be computed as the fixed chassis power budget less the power already allocated in the form of power permissions to other servers already installed in the chassis. In step 52, if the server power limit is less than or equal to the unallocated chassis power, then a power permission is immediately granted to the inserted server in an amount equal to the value of the server power limit according to step 54. This power permission is thus granted prior to generating a server inventory for the inserted server, which is initiated in step 56. If, however, the server power limit is determined to be greater than the unallocated chassis power in conditional step 52, then no power permission is yet granted to the inserted server according to step 58.

The process of inventorying the server involves examining the server to identify components of the server and the corresponding component power requirement (CPR) of each component. Each iteration of step 60 involves identifying one of the components and the CPR of the identified component. The component power requirement is the actual amount of power the identified component requires, even though the component may not always operate at the full value of its CPR. Each time step 60 is repeated, another one of the server components is identified along with its CPR. The identity and component power requirement (CPR) of each component may be reported in stages to the chassis management module as the inventory progresses. For example, each stage may involve reporting the identity and CPR of one server component or a subset of fewer than all the server components on the inserted server. Each stage may also be timed, so that upon the expiration of a preselected time interval, the components and component power requirements identified during that time interval are reported.

Step 62 involves identifying a component category associated with the component identified in step 60, along with a component power limit predefined for that category. The predefined component power limit is a maximum amount of power that any component in that component category may consume, whereas the component power requirement is the maximum power that a particular component requires. Thus, for each component, the component power requirement may be equal to or less than the categorically-defined component power limit. Conditional step 64 involves comparing the component power requirement (determined in step 60) to the categorically-defined component power limit for that component type (determined in step 62). If the power requirement of the current component is less than the component power limit, then the difference between those two power values is determined. That difference is subtracted from the value of the server power limit (SPL) in step 66. Step 66 is applied to all the components inventoried up to that point, so that the difference between the categorically-defined component power limit and the component power requirement for each component inventoried thus far is subtracted from the value of the server power limit to obtain a "reduced" server power limit.

The reduced SPL is merely an intermediate calculation representing the maximum amount of power the server may consume based on what is known about the inventoried components, and does not represent an actual reduction in the server power limit, since the server power limit is fixed for a particular server. For example, if the server power limit specified for a type-ABC server is 500 W, but the component power requirement of an installed CPU is 25 W less than a categorically-defined component power limit of 50 W for processors, then the server power consumption is expected to be no greater than a reduced SPL value of 475 W, which is equal to the 500 W server power limit reduced by 25 W. The sequence of steps 60, 62, 64, 66, 68, 72, and 74 spell out an iterative process whereby a diminishing worst-case power consumption value (the reduced server power limit calculation) is obtained for an inserted blade as information about the server is obtained. Thus, the power permission may be granted to the server as early as possible, and the value of a previously granted power permission may be progressively diminished, if possible, as the inventorying process advances.

In conditional step 68, the reduced server power value (computed in step 66) is compared to the unallocated chassis power. If the reduced server power value is less than or equal to the unallocated chassis power, then step 70 involves either granting or updating a power permission to the server in the amount of the reduced server power. If a power permission was previously granted in step 54 prior to initiating the process of generating an inventory, or in a preceding iteration of step 70, then the power permission is updated (lowered) in step 70 to the amount of the reduced server power calculated in step 66. If a power permission was not previously granted, but the reduced server power value computed in step 66 is now less than or equal to the unallocated chassis power based on the components inventoried so far, then power permission is granted in step 70. If, alternatively, the reduced server power value calculated in step 66 exceeds the unallocated chassis power according to conditional step 68, then the power permission is not granted or adjusted. Conditional step 72 determines whether the server inventory is complete. The server inventory is complete if all of the server components have been identified and a total power requirement of the identified server components obtained. If the server inventory is incomplete, as determined according to step 72, then the next component to be inventoried is selected in step 74, and another iteration of step 62 is applied to the component selected in step 74.

The flowchart of FIG. 2 describes how power permissions may be minimized by detecting that optional server components are either absent or have component power requirements that are less than categorically-defined component power limits specified for a server of that type. Optionally, power permissions may be reduced even further than as described in the flowchart of FIG. 2, by also identifying that the server or component thereof is capable of operating in a throttled, or reduced power state. Thus, if the server management module knows that it can force processors to stay in a throttled state, the server management module could report an even lower server power requirement and/or component power requirements, and enforce the throttled states as a matter of policy if desired. Such an approach may be used in a case of difficult power loading, such as if every bay of the chassis had a server, and each server's power requirement were equal to or nearly as high as the categorically-defined server power limit, so that the chassis power budget would otherwise be exceeded without enforcing the throttled state of one or more servers or server components. At another extreme, if the chassis power budget were sufficient to operate servers at up to the server power requirements or server power limits, the servers might be allowed by the chassis management module to operate at their highest performance capabilities.

FIG. 3 is a table of a chassis power budget for the hypothetical XYZ chassis 12 of FIG. 1. The chassis power budget is 2000 W in this example, so that no more than a total of 2000 W may be allocated to all of the servers in the chassis combined. A total of M server bays are included, as identified in column 62. However, not all of the server bays need to be occupied for a fully functioning chassis. The first four bays are presently occupied by type-ABC servers, as indicated in column 64, which have a 500 W server power limit, as indicated in column 66. The servers in server bays 1-4 have previously been inventoried and therefore have known server power requirements listed in column 68. The server power requirements are based on the total component power requirements of the individual servers. As indicated in column 68, the server in Bay 1 requires 400 W, the server in Bay 2 requires 450 W, the server in Bay 3 requires 300 W, and the server in Bay 4 requires 400 W, which power requirements are all less than the 500 W server power limit for a type-ABC server. Server M is not yet installed, and therefore has not been inventoried. The amount of power required by Server M is to be determined upon insertion and inventorying Server M to obtain the server components and their respective power requirements. If all five servers (1-4 and M) each consumed the server power limit of 500 W, then the chassis power budget of 2000 W would already be met by the servers in Bays 1-4. However, because the servers 1-4 consume a total power of 1550 W, the unallocated chassis power is 450 W prior to inserting server M.

FIG. 4 is a chart of an inventory for Server M prepared in response to insertion of Server M into the chassis. The chart is arranged in the order that server components of Server M are added to the inventory. Times T1 through T8 are listed in column 70, occurring in chronological order. The components are numbered in the time-order in which they are added to the inventory in column 72. The category of each component is indicated in column 74. The categorically-defined component power limit for the components is indicated in column 76. As the process of generating an inventory progresses, the actual component power requirement is obtained as indicated in column 78. Thus, for example, component 1 (Processor 1) is added to the inventory at time T1, and is determined to be a processor having a categorically-defined component power limit of 100 W, and an actual power requirement of only 75 W; Component 2 (Processor 2) is added to the inventory at time T2, and is determined to also be a processor having a categorically-defined component power limit of 100 W, and an actual power requirement of only 75 W; Components 3-10 (DIMMs 1-8) are added to the inventory as a group at time T3, and have a total categorically-defined component power limit of 50 W but a total component power requirement of only 30 W; and so forth.

Because Processors 1 and 2 each have a power requirement of 25 W less than their categorically-defined component power limit, it can already be determined at time T2 that Server M will require at most 450 W, which is a reduced SPL value computed as the type-ABC server power limit of 500 W reduced by 50 W. This 450 W reduced SPL value can be satisfied by the unallocated chassis power of 450 W. Thus, power permission of 450 W can already be granted at time T2, which may be a substantial amount of time before every component in Server M has been added to the inventory. Although not required, the power permission to Server M may be updated at any point when it is determined that one of the components added to the inventory has a component power requirement that is less than the categorically-defined component power limit for a component of that category. Upon completion of the inventorying of Server M at about Time $T_N$, the power permission to Server M may be reduced to the actual power requirement of Server M, which is 350 W.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method, comprising:
   allocating a fixed chassis power budget among one or more servers in a multi-server chassis;
   detecting an insertion of a server into the multi-server chassis;
   initially granting a power permission to the inserted server;

after granting the power permission, generating an inventory of the inserted server in a plurality of stages, each stage including identifying one or more of a plurality of server components and obtaining a component power requirement of each server component identified in that stage; and upon completion of each stage, adjusting the power permission to the inserted server according to the component power requirements of the one or more server components inventoried in that stage.

2. The method of claim 1, further comprising:

identifying a server type of the inserted server and obtaining a server power limit predefined for the server type, wherein total power requirements of the plurality of server components is less than or equal to the server power limit; and initially setting the power permission equal to the server power limit prior to initiating the step of generating the inventory.

3. The method of claim 2, further comprising:

setting the power permission equal to the total power requirements of the plurality of server components upon completion of the inventory.

4. The method of claim 1, further comprising:

identifying a component category associated with each inventoried component;

obtaining a predefined component power limit for each component category, wherein the component power requirement for one or more of the server components is less than the component power limit of the associated component categories; and for each inventoried component having a component power requirement of less than the component power limit for the associated component category, reducing the power permission to the server by an amount equal to the difference between the component power limit and the component power requirement of the inventoried component.

5. The method of claim 4, further comprising:

computing an unallocated chassis power as the fixed chassis power budget minus any presently granted power permissions; and increasing the unallocated chassis power by an amount equal to each reduction of the power permission to the inserted server.

6. The method of claim 1, further comprising:

computing a total of the power requirement of the server components after all of the server components have been inventoried; and setting the power permission to the inserted server equal to the total power requirement of the server components.

7. The method of claim 1, further comprising:

setting the power permission to a value of less than a total power requirement of the server components; and continuously throttling the one or more of the server components to enforce the power permission.

8. A power management system, comprising:

a local controller on a server, the local controller configured for generating an inventory of server components of the server in a plurality of stages in response to insertion of the server into a multi-server chassis, wherein each stage includes identifying one or more of the server components and obtaining a component power requirement of each server component identified in that stage, and the local controller further configured for requesting a reduced power permission upon completion of the inventory as a function of the inventoried server components; and a supervisory controller on the multi-server chassis, the supervisory controller for dynamically allocating a fixed chassis power budget among servers in the chassis, including initially granting a power permission to the inserted server before performing the inventory and subsequently granting the reduced power permission to the inserted server upon completion of the inventory.

9. The power management system of claim 8, wherein the supervisory controller is configured for identifying a server type of the inserted server and obtaining a server power limit predefined for the server type, wherein a total of the power requirements of the plurality of server components is less than or equal to the server power limit, and initially setting the power permission equal to the server power limit before performing the inventory.

10. The power management system of claim 8, wherein the local controller on each server comprises a service processor on a system board of the inserted server.

11. The power management system of claim 8, wherein the supervisory controller comprises a hot-pluggable chassis management module.

12. The power management system of claim 8, wherein the server components comprise hardware components, software components, or combinations thereof.

13. The power management system of claim 12, wherein the hardware components are selected from the group consisting of a processor, a memory module, a graphics card, and a hard drive.

14. A computer program product including computer usable program code embodied on a non-transitory computer readable storage medium, the computer program product including:

computer usable program code for allocating a fixed chassis power budget among one or more servers in a multi-server chassis;

computer usable program code for detecting an insertion of a server into the multi-server chassis;

computer usable program code for receiving and granting a request for a power permission from the inserted server;

computer usable program code for, after granting the power permission, generating an inventory of the inserted server in a plurality of stages, each stage including identifying one or more of a plurality of server components and obtaining a component power requirement of each server component identified in that stage; and computer usable program code for, upon completion of each stage, adjusting the power permission to the inserted server according to the component power requirements of the one or more server components inventoried in that stage.

15. The computer program product of claim 14, further comprising:

computer usable program code for identifying a server type of the inserted server and obtaining a server power limit predefined for the server type, wherein a total of the power requirements of the plurality of server components is less than or equal to the server power limit; and computer usable program code for setting the power permission equal to the server power limit.

* * * * *